United States Patent
Zhang et al.

(10) Patent No.: US 11,184,001 B2
(45) Date of Patent: Nov. 23, 2021

(54) POWER SWITCHING DEVICES WITH HIGH DV/DT CAPABILITY AND METHODS OF MAKING SUCH DEVICES

(71) Applicant: Cree, Inc., Durham, NC (US)

(72) Inventors: Qingchun Zhang, Cary, NC (US); Adam Barkley, Raleigh, NC (US); Sei-Hyung Ryu, Cary, NC (US); Brett Hull, Raleigh, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 16/811,526

(22) Filed: Mar. 6, 2020

(65) Prior Publication Data
US 2020/0212908 A1 Jul. 2, 2020

Related U.S. Application Data

(63) Continuation of application No. 15/699,149, filed on Sep. 8, 2017, now Pat. No. 10,601,413.

(51) Int. Cl.
*H01L 29/78* (2006.01)
*H03K 17/12* (2006.01)
(Continued)

(52) U.S. Cl.
CPC ....... *H03K 17/127* (2013.01); *H01L 29/0615* (2013.01); *H01L 29/1095* (2013.01);
(Continued)

(58) Field of Classification Search
CPC ........ H01L 27/105–11597; H01L 27/085–098; H01L 27/0705–0722; H01L 27/0635;
(Continued)

(56) References Cited

U.S. PATENT DOCUMENTS 5,686,750 A * 11/1997 Takahashi ........... H01L 29/7805
257/328
6,049,108 A * 4/2000 Williams ............ H01L 29/7811
257/341
(Continued)

FOREIGN PATENT DOCUMENTS

JP 2003069016 3/2003

OTHER PUBLICATIONS

Notification of Transmittal of the International Search Report and the Written Opinion of the International Searching Authority, or the Declaration for corresponding International Application No. PCT/US2018/047269, dated Nov. 23, 2018.

*Primary Examiner* — Jarrett J Stark
(74) *Attorney, Agent, or Firm* — Myers Bigel, P.A.

(57) ABSTRACT

Power switching devices include a semiconductor layer structure that has an active region and an inactive region. The active region includes a plurality of unit cells and the inactive region includes a field insulating layer on the semiconductor layer structure and a gate bond pad on the field insulating layer opposite the semiconductor layer structure. A gate insulating pattern is provided on the semiconductor layer structure between the active region and the field insulating layer, and at least one source/drain contact is provided on the semiconductor layer structure between the gate insulating pattern and the field insulating layer.

24 Claims, 7 Drawing Sheets

(51) Int. Cl.
 *H01L 29/423*    (2006.01)
 *H01L 29/10*     (2006.01)
 *H01L 29/739*    (2006.01)
 *H01L 29/06*     (2006.01)
 *H01L 29/16*     (2006.01)
 *H01L 29/417*    (2006.01)
 *H01L 29/40*     (2006.01)

(52) U.S. Cl.
 CPC .... *H01L 29/1608* (2013.01); *H01L 29/41741* (2013.01); *H01L 29/42372* (2013.01); *H01L 29/7395* (2013.01); *H01L 29/7397* (2013.01); *H01L 29/7811* (2013.01); *H01L 29/7813* (2013.01); *H01L 29/0696* (2013.01); *H01L 29/402* (2013.01)

(58) Field of Classification Search
 CPC ......... H01L 27/0617–0623; H01L 21/823857; H01L 21/82385; H01L 21/823842; H01L 21/8236; H01L 21/823462; H01L 21/823456; H01L 21/82345; H01L 29/41725–41791; H01L 29/7839; H01L 29/806; H01L 21/823475; H01L 21/823871
 See application file for complete search history.

(56) References Cited

U.S. PATENT DOCUMENTS

| | | | |
|---|---|---|---|
| 8,492,208 B1 * | 7/2013 | Cohen | .................. H01L 29/775 438/151 |
| 8,492,836 B2 | 7/2013 | Miura et al. | |
| 8,513,735 B2 | 8/2013 | Nakata et al. | |
| 8,723,259 B2 | 5/2014 | Nakao et al. | |
| 8,928,077 B2 * | 1/2015 | Lee | ..................... H01L 29/0634 257/339 |
| 9,006,819 B2 | 4/2015 | Shiro et al. | |
| 9,024,364 B2 * | 5/2015 | Okano | ............. H01L 29/42392 257/255 |
| 2003/0132499 A1 | 7/2003 | Hatade et al. | |
| 2005/0184336 A1 * | 8/2005 | Takahashi | ........... H01L 29/0634 257/328 |
| 2008/0179671 A1 * | 7/2008 | Saito | ..................... H01L 29/404 257/341 |
| 2010/0140689 A1 * | 6/2010 | Yedinak | .............. H01L 29/0611 257/330 |
| 2010/0140695 A1 * | 6/2010 | Yedinak | .............. H01L 29/7811 257/334 |
| 2011/0284874 A1 * | 11/2011 | Miura | ................. H01L 29/7811 257/77 |
| 2012/0205669 A1 * | 8/2012 | Miura | ............... H01L 29/66068 257/77 |
| 2013/0020587 A1 | 1/2013 | Hino et al. | |
| 2014/0264569 A1 * | 9/2014 | Yedinak | .............. H01L 29/7811 257/330 |
| 2015/0187873 A1 | 7/2015 | Yedinak et al. | |
| 2016/0155794 A1 * | 6/2016 | Kim | ............... H01L 29/66348 257/139 |
| 2017/0098705 A1 * | 4/2017 | Harrington, III | ... H01L 29/0696 |
| 2017/0301788 A1 * | 10/2017 | Fukui | .................. H01L 29/0661 |
| 2018/0166554 A1 * | 6/2018 | Hisada | .............. H01L 21/02271 |

\* cited by examiner

POWER SWITCHING DEVICES WITH HIGH DV/DT CAPABILITY AND METHODS OF MAKING SUCH DEVICES

CROSS-REFERENCE TO RELATED APPLICATION

This application is a continuation of U.S. patent application Ser. No. 15/699,149, filed Sep. 8, 2017, entitled "POWER SWITCHING DEVICES WITH DV/DT CAPABILITY AND METHODS OF MAKING SUCH DEVICES," the contents of which is incorporated herein by reference as if set forth in its entireties.

FIELD

The present invention relates to semiconductor devices and, more particularly, to power semiconductor switching devices.

BACKGROUND

The Metal Oxide Semiconductor Field Effect Transistor ("MOSFET") is a well known type of semiconductor transistor that may be used as a switching device. A MOSFET is a three terminal device that includes a source region and a drain region that are separated by a channel region, and a gate electrode that is disposed adjacent the channel region. A MOSFET may be turned on or off by applying a gate bias voltage to the gate electrode. When a MOSFET is turned on (i.e., it is in its "on-state"), current is conducted through the channel region of the MOSFET between the source region and the drain region. When the bias voltage is removed from the gate electrode (or reduced below a threshold level), the current ceases to conduct through the channel region. By way of example, an n-type MOSFET has n-type source and drain regions and a p-type channel. An n-type MOSFET thus has an "n-p-n" design. An n-type MOSFET turns on when a gate bias voltage is applied to the gate electrode that is sufficient to create a conductive n-type inversion layer in the p-type channel region that electrically connects the n-type source and drain regions, thereby allowing for majority carrier conduction therebetween.

The gate electrode of a power MOSFET is typically separated from the channel region by a thin gate insulating pattern, such as a silicon oxide pattern. Because the gate electrode of the MOSFET is insulated from the channel region by the gate insulating pattern, minimal gate current is required to maintain the MOSFET in its on-state or to switch the MOSFET between its on-state and its off-state. The gate current is kept small during switching because the gate forms a capacitor with the channel region. Thus, only minimal charging and discharging current is required during switching, allowing for less complex gate drive circuitry.

The bipolar junction transistor ("BJT") is another well known type of semiconductor transistor that is also routinely used as a switching device. A BJT includes two p-n junctions that are formed in close proximity to each other in the semiconductor material. In operation, charge carriers enter a first region of the semiconductor material (the emitter) that is adjacent one of the p-n junctions. Most of the charge carriers exit the device from a second region of the semiconductor material (the collector) that is adjacent the other p-n junction. The collector and emitter are formed in regions of the semiconductor material that have the same conductivity type. A third, relatively thin region of the semiconductor material, known as the base, is positioned between the collector and the emitter and has a conductivity type that is opposite the conductivity type of the collector and the emitter. Thus, the two p-n junctions of the BJT are formed where the collector meets the base and where the base meets the emitter. By flowing a small current through the base of a BJT, a proportionally larger current passes from the emitter to the collector.

BJTs are current controlled devices in that a BJT is turned "on" (i.e., it is biased so that current flows between the emitter and the collector) by flowing a current through the base of the transistor. For example, in an n-p-n BJT (i.e., a BJT that has n-type collector and emitter regions and a p-type base region), the transistor is typically turned on by applying a positive voltage to the base to forward bias the base-emitter p-n junction. When the device is biased in this manner, the hole current that flows into the base of the transistor is injected into the emitter. The holes are referred to as "majority carriers" because the base is a p-type region, and holes are the "normal" charge carriers in such a region. In response to the hole current into the emitter, electrons are injected from the emitter into the base, where they diffuse toward the collector. These electrons are referred to as "minority carriers" because electrons are not the normal charge carrier in the p-type base region. The device is referred to as a "bipolar" device because the emitter-collector current includes both electron and hole current.

A BJT may require a relatively large base current to maintain the device in its on-state. As such, relatively complex external drive circuits may be required to supply the relatively large base currents that can be required by high power BJTs. Moreover, the switching speeds of BJTs may be significantly slower than the switching speeds of power MOSFETs due to the bipolar nature of the current conduction.

A third well known type semiconductor switching device is the Insulated Gate Bipolar Transistor ("IGBT"), which is a device that combines the high impedance gate of the power MOSFET with the small on-state conduction losses of the power BJT. An IGBT may be implemented, for example, as a Darlington pair that includes a high voltage n-channel MOSFET at the input and a BJT at the output. The base current of the BJT is supplied through the channel of the MOSFET, thereby allowing a simplified external drive circuit.

There is an increasing demand for high power semiconductor switching devices that can pass large currents in their "on" state and block large voltages (e.g., hundreds or even thousands of volts) in their reverse blocking state. In order to support high current densities and block such high voltages, power MOSFETs and IGBTs typically have a vertical structure with the source and drain on opposite sides of a thick semiconductor layer structure in order to block higher voltage levels. In very high power applications, the semiconductor switching devices are typically formed in wide band-gap semiconductor material systems (herein, the term "wide band-gap semiconductor" encompasses any semiconductor having a band-gap of at least 1.4 eV) such as, for example, silicon carbide ("SiC"), which has a number of advantageous characteristics including, for example, a high electric field breakdown strength, high thermal conductivity, high electron mobility, high melting point and high-saturated electron drift velocity. Relative to devices formed in other semiconductor materials such as, for example, silicon, electronic devices formed in silicon carbide may have the capability of operating at higher temperatures, at high power densities, at higher speeds, at higher power levels and/or under high radiation densities.

Vertical power MOSFET and IGBT designs may have a planar gate or a trench gate design. A common planar gate design has a gate electrode on the upper surface of the device and a channel region that is located under the gate electrode. In such devices, the current flow through the channel is in a horizontal direction (i.e., the channel defines a plane that is generally parallel to the substrate). These devices may support very high blocking voltages, but typically exhibit a higher on-state resistance as the channel is narrow and hence the resistance of the channel may be relatively high. In trench gate designs, the gate electrode is formed in a trench that extends vertically into the device adjacent the source region (in an n-type device). The gate electrode may penetrate a well region in which the source region is disposed and may terminate within the drift region. In these devices, the channel is formed in a portion of the well region between the source region and the drift region such that current flow through the channel is in the vertical direction (i.e., the channel defines a plane that is generally normal to the substrate). In trench gate designs, the channel current may flow through a much larger area, which reduces the "on-resistance" of the device and thus allows the device to support higher current densities in on-state operation. One specific type of MOSFET having a trench gate structure is the UMOSFET, which refers to a vertical MOSFET having a trench that generally resembles a "U" shape.

SUMMARY

Pursuant to some embodiments of the present invention, power switching devices, such as MOSFETs and IGBTs, are provided that include a semiconductor layer structure that has an active region and an inactive region. The active region includes a plurality of unit cells and the inactive region includes a field insulating layer on the semiconductor layer structure and a gate pad on the field insulating layer opposite the semiconductor layer structure. A gate insulating pattern is provided on the semiconductor layer structure between the active region and the field insulating layer, and a source/drain contact is provided on the semiconductor layer structure between the gate insulating pattern and a center of the field insulating layer.

In some embodiments, the source/drain contact may penetrate the field insulating layer to contact the semiconductor layer structure.

In some embodiments, a thickness of the field insulating layer may be at least five times, ten times or even fifteen times a thickness of the gate insulating pattern.

In some embodiments, the semiconductor layer structure may have first and second opposed major surfaces, the power switching device further comprising a first source/drain contact on the first major surface and a second source/drain contact on the second major surface.

In some embodiments, the semiconductor layer structure may be a silicon carbide semiconductor layer structure.

In some embodiments, the source/drain contact is one of a plurality of source/drain contacts that are provided on the inactive region of the semiconductor layer structure. Each of the plurality of source/drain contacts may penetrate the field insulating layer to contact the semiconductor layer structure.

In some embodiments, the field insulating layer may include a plurality of sidewalls, and a first of the plurality of source/drain contacts may be closer to a first of the sidewalls of the field insulating layer than it is to a second of the sidewalls of the field insulating layer, and a second of the plurality of source/drain contacts may be closer to the second of the sidewalls of the field insulating layer than it is to the first of the sidewalls of the field insulating layer. A third of the plurality of source/drain contact layers may also be closer to a third of the sidewalls of the field insulating layer than it is to either the first or the second of the sidewalls of the field insulating layer.

In some embodiments, the power switching device comprises a power metal oxide semiconductor field effect transistor or a power insulated gate bipolar transistor.

Pursuant to further embodiments of the present invention, power switching devices are provided that include a semiconductor layer structure having first and second opposed major surfaces. The semiconductor layer structure includes an active region having a plurality of unit cell transistors and an inactive region that has a gate pad portion having a gate pad thereon. A source/drain contact is provided on the gate pad portion of the inactive region.

In some embodiments, the power switching device further includes a field insulating layer between the semiconductor layer structure and the gate pad in the inactive region, and a gate bond pad on the gate pad opposite the field insulating layer.

In some embodiments, the power switching device further includes a gate insulating pattern on the semiconductor layer structure between the active region and the field insulating layer, where the source/drain contact is between the gate insulating pattern and a center of the field insulating layer.

In some embodiments, the source/drain contact may penetrate the field insulating layer to contact the semiconductor layer structure.

Pursuant to still further embodiments of the present invention, power switching devices are provided that include a semiconductor layer structure, a field insulating layer on the semiconductor layer structure, a gate insulating pattern on the semiconductor layer structure, a gate pad on the field insulating layer and on the gate insulating pattern and a source/drain contact between a central portion of the field insulating layer and the gate insulating pattern.

In some embodiments, the field insulating layer and the gate pad may be on an inactive region of the semiconductor layer structure, and the semiconductor layer structure may further include an active region that includes a plurality of unit cell transistors.

In some embodiments, the source/drain contact may be on an inactive region of the semiconductor layer structure.

In some embodiments, the source/drain contact may be one of a plurality of source/drain contacts that are provided on the inactive region of the semiconductor layer structure.

In some embodiments, each of the plurality of source/drain contacts may penetrate the field insulating layer to contact the semiconductor layer structure.

In some embodiments, the field insulating layer may include a plurality of sidewalls, and a first of the plurality of source/drain contacts may be closer to a first of the sidewalls of the field insulating layer than it is to a second of the sidewalls of the field insulating layer, and a second of the plurality of source/drain contacts may be closer to the second of the sidewalls of the field insulating layer than it is to the first of the sidewalls of the field insulating layer.

In some embodiments, the source/drain contact may penetrates the field insulating layer to contact the semiconductor layer structure.

In some embodiments, the semiconductor layer structure may have first and second opposed major surfaces, and the power switching device may further include a first source/drain contact on the first major surface and a second source/drain contact on the second major surface.

Pursuant to further embodiments of the present invention, power switching devices are provided that include a semiconductor layer structure having an active region and an inactive region, a field insulating layer on the inactive region of the semiconductor layer structure, a gate insulating pattern on the active region of the semiconductor layer structure, a gate electrode pattern having a gate pad on the field insulating layer and gate fingers on the gate insulating pattern, the gate pad including a plurality of openings that expose portions of the inactive region of the semiconductor layer structure, and a plurality of source/drain contacts that are within respective openings in the field insulating layer.

In some embodiments, the power switching device further may include a gate bond pad having a plurality of openings on the gate pad opposite the field insulating layer, where the source/drain contacts are within respective of the openings in the gate bond pad.

In some embodiments, the power switching device further may include at least one bond wire bonded to the gate bond pad.

Pursuant to further embodiments of the present invention, power switching devices are provided that include a semiconductor layer structure having an active region and an inactive region. The device includes a shunt displacement current path that is configured to shunt dV/dt-induced displacement current through the inactive region to a source/drain contact.

Pursuant to further embodiments of the present invention, power MOSFETs are provided that include a silicon carbide semiconductor layer structure having an active region and an inactive region, a plurality of unit cell MOSFET transistors formed in the active region of the silicon carbide semiconductor layer structure, a field insulating layer on the inactive region of the silicon carbide semiconductor layer structure and a gate pad on the field insulating layer. A dV/dt displacement current capability of the power switching device may be at least 90 V/nanosecond. In some embodiments, the dV/dt displacement current capability of the MOSFET may be between 100 V/nanosecond and 140 V/nanosecond, or between 90 V/nanosecond and 150 V/nanosecond. These power MOSFETs may include a shunt displacement current path that is configured to shunt dV/dt-induced displacement current through the inactive region of the silicon carbide semiconductor layer structure to a source/drain contact that is on the inactive region of the silicon carbide semiconductor layer structure.

DETAILED DESCRIPTION

Figure 1:
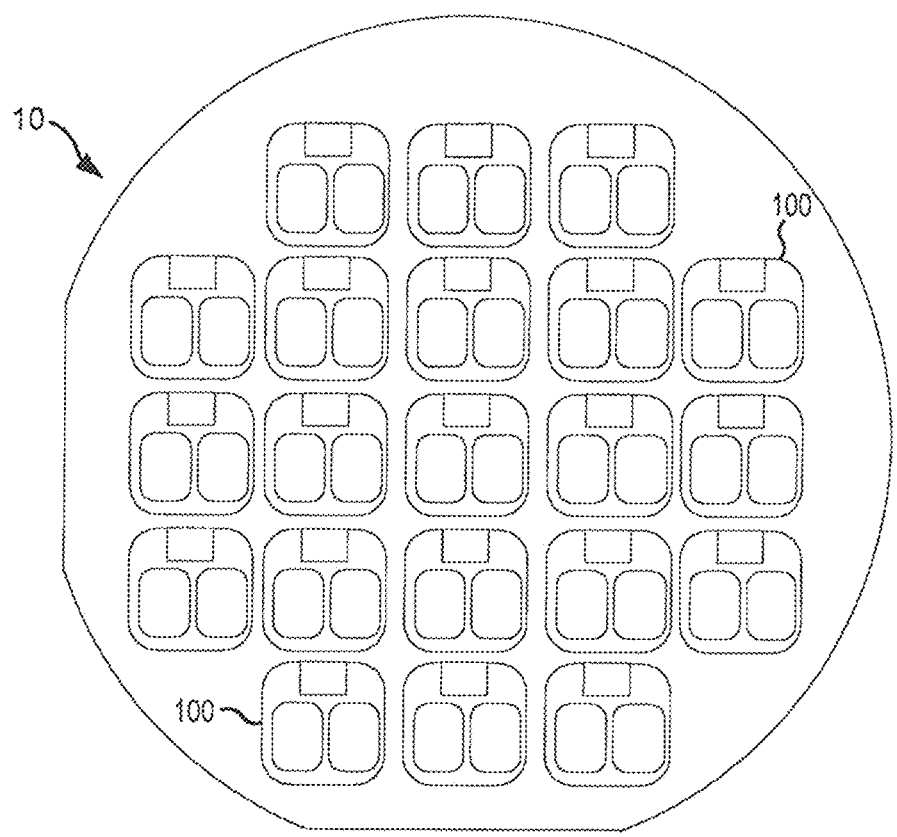
FIG. 1 is a schematic plan view of a semiconductor wafer that includes a plurality of power switching devices according to embodiments of the present invention.

Power silicon carbide MOSFETs are in use today for applications requiring high voltage blocking such as voltage blocking of 5,000 volts or more. By way of example, silicon carbide MOSFETs are commercially available that are rated for current densities of 10 A/cm$^2$ or more that will block voltages of at least 10 kV. To form such devices, a plurality of "unit cells" are typically formed, where each unit cell includes a MOSFET transistor. In high power applications, a large number of these unit cells (e.g., hundreds or thousands) are typically provided on a single semiconductor substrate, and a gate electrode pattern is formed on a top side of the semiconductor substrate that acts as the gate electrode for all of the unit cells. The opposite (bottom) side of the semiconductor substrate acts as a common drain for all of the units cells of the device. A plurality of source contacts are formed on source regions in the semiconductor layer structure that are exposed within openings in the gate electrode pattern. These source contacts are also electrically connected to each other to serve as a common source. The resulting device has three terminals, namely a common source terminal, a common drain terminal and a common gate electrode that act as the terminals for the hundreds or thousands of individual unit cell transistors. It will be appreciated that the above description is of an n-type MOSFET; the locations of the drain and source would be reversed for a p-type MOSFET.

The gate electrode pattern of a power MOSFET may be implemented by forming a patterned conductive layer that includes a plurality of elongated gate fingers that extend through an active region of the device. The patterned conductive layer may comprise a semiconductor layer such as, for example, a polysilicon layer. The patterned conductive layer may also include a gate pad in an inactive region of the device, and each gate finger may connect to the gate pad, either directly or via one or more gate buses. The gate pad portion of the gate electrode pattern may be formed on a thick field insulating layer. The field insulating layer may comprise, for example, a field oxide layer (e.g., a silicon oxide layer), although other insulating materials or a combination of insulating, materials may be used. A metal gate bond pad may be formed on top of a portion of the gate pad and may form an ohmic contact thereto. Bond wires may be attached to the gate bond pad to provide a mechanism for applying a bias voltage to the gate fingers of the device.

The gate electrode pattern and the metal layers/bond pads for the source, gate and drain are formed on a semiconductor layer structure. The semiconductor layer structure has an active region in which the unit cell transistors are formed and an inactive region. The inactive region may include a gate pad portion that is underneath the above-discussed gate pad and field insulating layer and a termination portion that may surround the active region. The gate pad portion of the inactive region of the semiconductor layer structure that is underneath the gate pad and field insulating layer typically includes an implanted region in an upper surface thereof. For example, in an n-type MOSFET, a large p-type silicon carbide region is formed via ion implantation in the upper surface of the semiconductor layer structure. Thereafter, the field insulating layer is formed on this p-type silicon carbide region. During operation, the MOSFET may switch from reverse blocking state (where the device may block a very large voltage and not conduct current) to the on-state (where the device may conduct large currents) in a very short period of time. As the device switches states, a displacement current is generated that flows between the drain terminal on the bottom surface of the device and the source terminal on the upper surface of the device (in an n-type device).

The displacement current may flow in both the active region and the gate pad portion of the inactive region of the semiconductor layer structure. In each case, the magnitude of the displacement current ($I_{Disp}$) is the product of the change in voltage per unit time (dV/dt) across the p-n junction in the silicon carbide semiconductor layer structure and the capacitance of this p-n junction ($C_{pn}$). In other words:

$$I_{Disp}=(dV/dt)*C_{pn}$$

In the active region, there are many paths for the displacement current (since each unit cell includes a pair of source contacts) and the p-n junctions are small (since a width in the horizontal direction of each p-well that forms a p-n junction with an underlying n-type layer may only be, for example, about 2-3 microns). As such, the capacitance of the p-n junction may be relatively small, reducing the magnitude of the displacement current in the active region. However, in the gate pad portion of the inactive region, the above-discussed p-type silicon carbide region that is formed underneath the field insulating layer may have a length (in each horizontal direction) of, for example, 100-300 microns, and the displacement current generated in this region must flow to the source contacts of the unit cells closest to the gate pad portion of the inactive region of the semiconductor layer structure. As such, the capacitance of the p-n junction underneath the gate pad portion of the inactive region may be much larger, resulting in a significantly larger displacement current.

When the displacement current flows, a voltage is generated in the implanted region of the semiconductor layer structure. Pursuant to Ohm's law, a value of this voltage is equal to the product of the displacement current and the resistance of the semiconductor layer structure along the displacement current path. In silicon carbide, implanted regions tend to have high sheet resistance. In the gate pad portion of the inactive region, the resistance may be high due to the implanted region underneath the field insulating layer and the capacitance of the p-n junction may be high for the reasons discussed above. As such, the displacement current flowing in the gate pad portion of the inactive region may generate high voltages in the semiconductor layer structure during device operation. If the generated voltage is sufficiently high, it may exceed the breakdown voltage of the field insulating layer. When this occurs, the field insulating layer may be damaged, which may result in device failure.

Typically, the field insulating layer may be relatively thick. For example, a typical thickness range for the field insulating layer might be between 600-800 nanometers, although other thicknesses may be used. However, at the edge of field insulating layer, a thin gate insulating pattern is provided between the gate electrode pattern and the implanted region of the semiconductor layer structure. This gate insulating pattern may comprise, for example, a silicon oxide pattern, although other insulating materials may be used. The gate insulating pattern may be between the source contacts and the field insulating layer, and hence the displacement current generated in the gate pad portion of the inactive region may flow underneath the gate insulating pattern. This gate insulating pattern may be much thinner than the field insulating layer, having a thickness of, for example, between 35-50 nanometers. For silicon oxide, the breakdown voltage may be about 12 MV/cm multiplied by the thickness of the oxide. Thus, the breakdown voltage for a 600 nanometer thick silicon oxide field insulating layer would be about 720 Volts. In contrast, the breakdown voltage for a 35 nanometer thick silicon oxide gate insulating pattern would only be about 42 Volts. As a result, if the dV/dt levels experienced by the device are too high, then the device may be subject to failure due to breakdown of the thin gate insulating pattern is provided adjacent the field insulating layer.

The dV/dt capability of a power MOSFET refers to the amount of voltage change that the device may withstand within a given period of time. Current state of the art silicon carbide power MOSFETs may be rated for dV/dt levels of about 30-80 V/nanosecond, and application of higher dV/dt levels may eventually result in device failure. In order to prevent the voltage generated in the thin gate insulating pattern that is adjacent the field insulating layer from exceeding the breakdown voltage thereof the switching speed of the device may be limited (which reduces the displacement current).

Pursuant to embodiments of the present invention, power switching devices such as power MOSFETs and IGBTs are provided that may support significantly higher dV/dt levels. As described above, in a conventional device, dV/dt induced device failures typically occur in the thin gate insulating pattern that extends along a perimeter that defines the boundary between the active and inactive regions of the device (i.e., the gate insulating pattern is adjacent or abutting the much thicker field insulating layer). The power MOSFETs and IGBTs according to embodiments of the present invention may have additional source/drain ohmic contacts formed through (or adjacent) the field insulating layer to provide a path for the displacement current that flows through the inactive region of the device and hence does not flow underneath the above-described thin gate insulating pattern. As a result, the voltage levels applied to the thin gate insulating pattern may be significantly reduced, allowing for significantly higher displacement currents without risking device failure. Moreover, since the field insulating layer may be on the order of 10-20 times as thick as the thin gate insulating pattern, the field insulating layer may have a much higher breakdown voltage and hence can withstand the higher displacement currents. Thus, the techniques according to embodiments of the present invention may improve both device performance (higher switching speeds) and device reliability (less chance of device failure).

In some embodiments, the additional source/drain ohmic contacts may be formed without any additional processing steps by simply using different masks during the formation of the field insulating layer, the gate electrode pattern, and/or the source/drain ohmic metal pattern. Thus, the above advantages may be achieved without any additional cost or process fabrication steps. In other embodiments, additional process steps may be included but the same benefits may still be achieved.

Pursuant to some embodiments of the present invention, power switching devices, such as MOSFETs and IGBTs, are provided that include a semiconductor layer structure that has an active region and an inactive region. The active region includes a plurality of unit cells and the inactive region includes a field insulating layer on the semiconductor layer structure and a gate pad on the field insulating layer opposite the semiconductor layer structure. A gate insulating pattern is provided on the semiconductor layer structure between the active region and the field insulating layer, and at least one source/drain contact is provided on the semiconductor layer structure between the gate insulating pattern and the field insulating layer.

Pursuant to further embodiments of the present invention, power switching devices, such as MOSFETs and IGBTs, are provided that include a semiconductor layer structure having first and second opposed major surfaces, an active region having a plurality of unit cell transistors and an inactive region that has a gate pad portion having a gate pad thereon. The device further includes at least one source/drain contact on the gate pad portion of the inactive region.

The device may include a field insulating layer between the semiconductor layer structure and the gate pad in the inactive region, and a gate bond pad on the gate pad opposite the field insulating layer. A gate insulating pattern may also be provided on the semiconductor layer structure between the active region and the field insulating layer and the at least one source/drain contact may be provided on the semiconductor layer structure between the gate insulating pattern and the field insulating layer. The at least one source/drain contact may penetrate the field insulating layer to contact the semiconductor layer structure.

Pursuant to still further embodiments of the present invention, power switching devices, such as MOSFETs and IGBTs, are provided that include a semiconductor layer structure, a field insulating layer on the semiconductor structure, a gate insulating pattern on the semiconductor structure, a gate pad on the field insulating layer and on the gate insulating pattern, and at least one source/drain contact between a central portion of the field insulating layer and the gate insulating pattern.

The field insulating layer and the gate pad may be on an inactive region of the semiconductor layer structure, and an active region of the semiconductor layer structure may include a plurality of unit cell transistors. The at least one source/drain contact may be in an inactive region of the semiconductor layer structure, and may penetrate the field insulating layer to contact the semiconductor layer structure.

Pursuant to further embodiments of the present invention, power switching devices are provided that include a semiconductor layer structure having an active region and an inactive region, a field insulating layer on the inactive region of the semiconductor layer structure, a gate insulating pattern on the active region of the semiconductor layer structure, a gate electrode pattern having a gate pad on the field insulating layer and gate fingers on the gate insulating pattern, the gate pad including a plurality of openings that expose portions of the inactive region of the semiconductor layer structure, and a plurality of source/drain contacts that are within respective openings in the field insulating layer.

In some embodiments, the power switching device further may include a gate bond pad having a plurality of openings on the gate pad opposite the field insulating layer, where the source/drain contacts are within respective of the openings in the gate bond pad. The power switching device may also include at least one bond wire bonded to the gate bond pad.

Pursuant to further embodiments of the present invention, power switching devices are provided that include a semiconductor layer structure having an active region and an inactive region, a field insulating layer on the inactive region of the semiconductor layer structure, a gate pad on the field insulating layer opposite the semiconductor layer structure, and a gate bond pad on the gate pad opposite the field insulating layer such that the field insulating layer, the gate pad and the gate bond pad are sequentially stacked on the semiconductor layer structure. A current path for a displacement current that flows between a first source/drain contact on a first major surface of the semiconductor layer structure and a second source/drain contact on a second major surface of the semiconductor layer structure that is opposite the first major surface extends through an opening in the field insulating layer. In some embodiments, a thickness of the field insulating layer may be at least 200 nanometers.

As described above, current dV/dt capability for a state-of-the-art power silicon carbide MOSFET is about 70-80 V/nanosecond, and for devices that undergo extensive switching (which can slowly damage the insulating layers) the specified dV/dt capability is only perhaps 30-80 V/nanosecond. Silicon carbide power MOSFETs according to embodiments of the present invention have been shown to have no degradation in performance after 120,000 switching cycles at drain-to-source dV/dt values of 110 V/nanosecond.

Thus, in some embodiments, power switching devices such as a silicon carbide power MOSFET are provided that have a dV/dt displacement current capability of at least 90 V/nanosecond. In other embodiments, the dV/dt displacement current capability of the power switching device may be at least 100 V/nanosecond. In some embodiments, the dV/dt displacement current capability of the power switching device may be between 90 V/nanosecond and 150 V/nanosecond. In other embodiments, the dV/dt displacement current capability of the power switching device may be between 100 V/nanosecond and 140 V/nanosecond. In still other embodiments, the dV/dt displacement current capability of the power switching device may be between 100 V/nanosecond and 120 V/nanosecond or between 90 V/nanosecond and 100 V/nanosecond.

Aspects of the present invention will now be discussed in greater detail with reference to the attached figures, in which example embodiments of the present invention are illustrated.

FIG. 1 is a schematic plan view of a wafer 10 that includes a plurality of power switching devices according to embodiments of the present invention. Referring to FIG. 1, the wafer 10 may be a thin planar structure that includes a semiconductor layer structure with other material layers such as insulating layers and/or metal layers formed thereon. The semiconductor layer structure may include a semiconductor substrate and/or a plurality of other semiconductor layers. A plurality of power switching devices 100 may be formed in the wafer 10. The switching devices 100 may be formed in rows and columns and may be spaced apart from each other so that the wafer 10 may later be singulated (e.g., diced) to separate the individual switching devices 100 for packaging and testing. The wafer 10 may comprise a silicon carbide substrate having one or more silicon carbide layers formed thereon (e.g., by epitaxial growth) in some embodiments. Other semiconductor layers (e.g., polysilicon layers), insulating layers and/or metal layers may be formed on the silicon carbide semiconductor layer structure to form the power switching devices 100. The silicon carbide substrate and the silicon carbide layers formed thereon may be 4H silicon carbide in some embodiments.

Figure 2A:
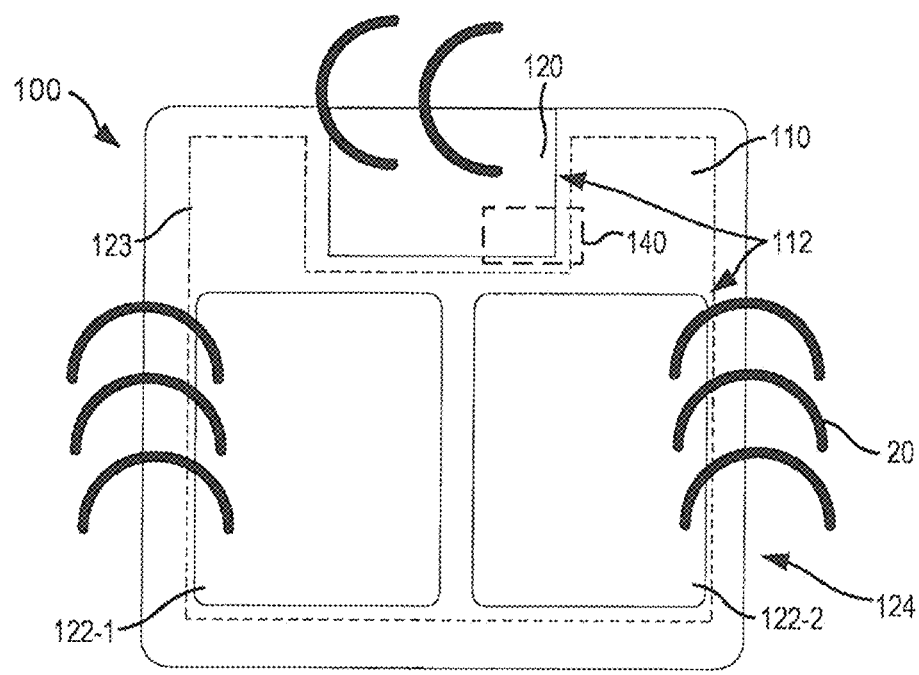
FIG. 2A is a schematic plan view of one of the power switching devices included on the semiconductor wafer of FIG. 1.
Figure 2B:
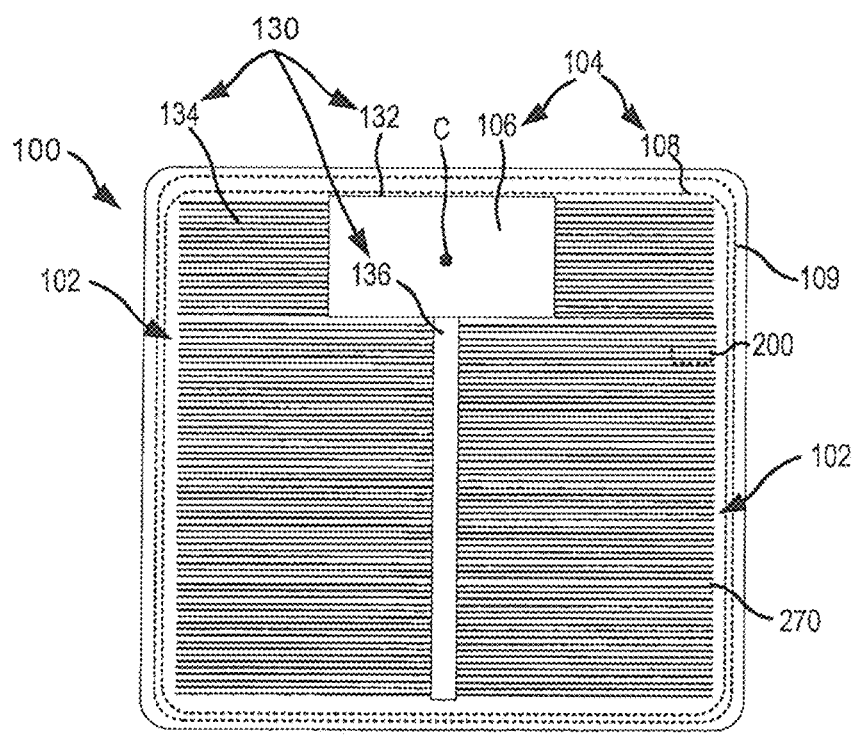
FIG. 2B is a schematic plan view of the power switching device of FIG. 2A with the source and gate metallization removed.

FIG. 2A is a schematic plan view of one of the power switching devices 100 included on the semiconductor wafer 10 of FIG. 1. FIG. 2B is a schematic plan view of the power switching device 100 of FIG. 2A with the source and gate metallization removed. In the description below it is assumed that the power switching device 100 is an n-type power MOSFET 100.

As shown in FIG. 2A, a protective layer 110 covers a substantial portion of the top surface of the power MOSFET 100. The protective layer 110 may be formed, for example, of polyamide. Various bond pads may be exposed through openings 112 in the protective layer 110. The bond pads may include a gate bond pad 120 and one or more source bond pads 122. Two source bond pads 122-1, 122-2 are illustrated in FIG. 2A. While not visible in FIG. 2A, a drain bond pad 124 may be provided on the bottom side of the MOSFET 100. The bond pads 120, 122, 124 may be formed of a metal, such as aluminum, that bond wires can be readily attached to via conventional techniques such as thermo-compression or soldering. As will be discussed in more detail below, source contacts are provided that contact a semiconductor layer structure of the MOSFET 100. The source contacts may be lower portions of a source metal pattern 123 that extends across much of the upper surface of the MOSFET 100 (e.g., all but the portion of the upper surface of the MOSFET 100 occupied by the gate bond pad 120). The source bond pads 122-1, 122-2 may comprise portions of the source metal pattern 123 that are exposed by the openings 112 in the protective layer 110. Bond wires 20 are shown in FIG. 2A that may be used to connect the gate bond pad 120 and the source bond pads 122-1, 122-2 to external voltage sources (not shown) such as terminals of other circuit elements.

As is shown in FIG. 2B, the MOSFET 100 includes a semiconductor layer structure that includes an active region 102 and an inactive region 104. The active region 102 is an area of the device that includes operable transistors (e.g., the unit cell transistors discussed herein), while the inactive region 104 is an area that does not include such operable transistors. The unit cell transistors 200 (see FIGS. 3-4) of the MOSFET 100 are formed in the active region 102. The location of one unit cell 200 is shown by a box 200 in FIG. 2B to provide context. The active region 102 may generally correspond to the area under the source metal pattern 123 in some embodiments. The inactive region 104 includes a gate pad portion 106 and a termination portion 108. The gate pad portion 106 of the inactive region 104 may approximately correspond to the portion of the semiconductor layer structure that is underneath the gate pad 120. The termination portion 108 of the inactive region 104 may extend around a periphery of the MOSFET 100 and may include one or more termination structures such as guard rings and/or a junction termination extension that can reduce electric field crowding that may occur around the edge of the device. The termination structures (shown as guard rings 109) may spread out the electric fields along the periphery of the MOSFET, reducing electric field crowding. The edge termination structures may serve to increase the reverse blocking voltage at which a phenomenon known as "avalanche breakdown" occurs where an increasing electric field result in runaway generation of charge carriers within the semiconductor device, resulting in a sharp increase in current that may damage or even destroy the device.

As is further shown in FIG. 2B, a gate electrode pattern 130 may be provided that includes a gate pad 132, a plurality of gate fingers 134, and one or more gate buses 136 that electrically connect the gate fingers 134 to the gate pad 132. The gate pad 132 portion of the gate electrode pattern 130 may be underneath the gate bond pad 120 in the gate pad portion 106 of the inactive region 104, and the gate fingers 134 may extend horizontally across the active region 102. An insulating layer (not shown) may cover the gate fingers 134 and gate bus(es) 136. The source metal pattern 123 may be provided over the gate fingers 134 and insulating layer, with the source contacts of the source metal layer contacting corresponding source regions in the semiconductor layer structure in openings between the gate fingers 134.

Figure 3:
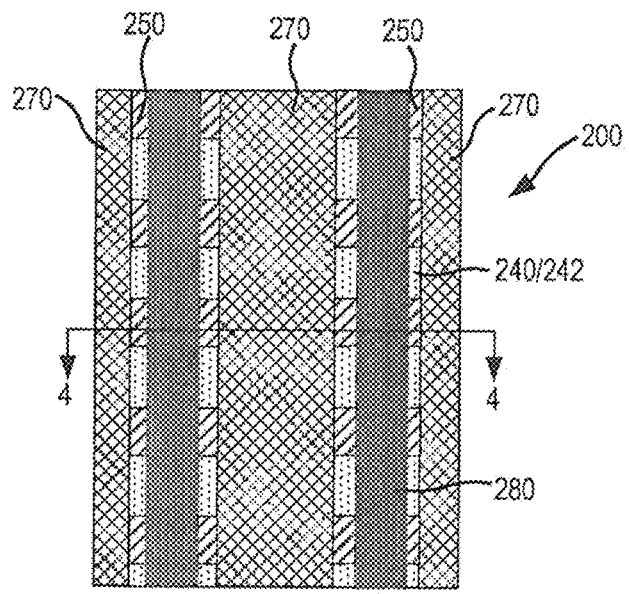
FIG. 3 is a schematic plan view of a portion of a unit cell of the power switching device of FIGS. 2A-2B.
Figure 4:
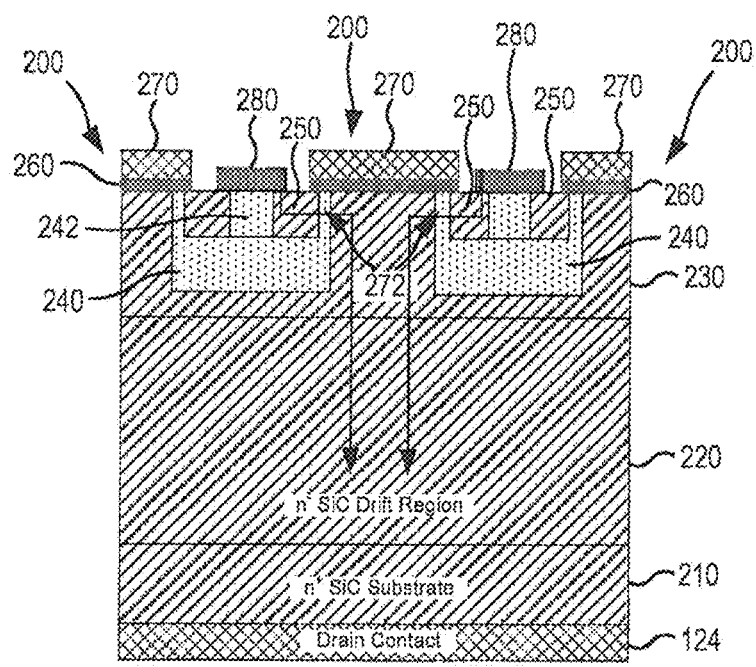
FIG. 4 is a schematic cross-sectional diagram taken along the line 4-4 of FIG. 3.

FIG. 3 is a schematic plan view of a portion of a unit cell 200 of the power MOSFET 100 of FIGS. 2A-2B. FIG. 4 is a schematic cross-sectional diagram taken along the line 4-4 of FIG. 3 that illustrates the unit cell structure in an active region of the device. It will be appreciated that the specific layer structure, doping concentrations, materials, conductivity types and the like that are shown in FIGS. 3-4 and/or described below are merely provided as examples to illustrate in detail the structure of a specific example embodiment. Thus, the specific details discussed below are not limiting to the present invention.

Referring to FIGS. 2A-4, the unit cell 200 is part of the active region 102 of MOSFET 100. The unit cell 200 may be one of a plurality of unit cells 200 that are electrically disposed in parallel. It will be appreciated that FIG. 4 illustrates one full unit cell 200 and portions of two additional unit cells 200 on either side thereof in order to provide context.

As shown in FIGS. 3-4, the power MOSFET 100, and hence the unit cell 200, includes an n-type wide band-gap semiconductor substrate 210. The substrate 210 may comprise, for example, a single crystal 4H silicon carbide semiconductor substrate. The substrate 210 may be heavily-doped with n-type impurities (i.e., an n$^+$ silicon carbide substrate). The impurities may comprise, for example, nitrogen or phosphorous. The doping concentration of the substrate 210 may be, for example, between $1 \times 10^{18}$ atoms/cm$^3$ and $1 \times 10^{21}$ atoms/cm$^3$, although other doping concentrations may be used. The substrate 210 may be any appropriate thickness (e.g., between 100 and 500 microns thick.

A lightly-doped n-type (n) silicon carbide drift region 220 is provided on the substrate 210. The n-type silicon carbide drift region 220 may be formed by, for example, epitaxial growth on the silicon carbide substrate 210. The n-type silicon carbide drift region 220 may have, for example, a doping concentration of $1 \times 10^{16}$ to $5 \times 10^{17}$ dopants/cm$^3$. The n-type silicon carbide drift region 220 may be a thick region, having a vertical height above the substrate 210 of, for example, 3-100 microns. An upper portion of the n-type silicon carbide drift region 220 may comprise an n-type silicon carbide current spreading layer 230 in some embodiments. The n-type silicon carbide current spreading layer 230 may be grown in the same processing step as the remainder of the n-type silicon carbide drift region 220 and may be considered to be part of the n-type silicon carbide drift region 220. The n-type current spreading layer 230 may be a moderately-doped current spreading layer 230 that has a doping concentration (e.g., doping concentration of $1 \times 10^{16}$ to $5 \times 10^{18}$ dopants/cm$^3$) that exceeds the doping concentration of the remainder of the more lightly-doped n-type silicon carbide drift layer 220. The n-type current spreading layer 230 may be omitted in some embodiments.

An upper portion of the n-type current spreading layer 230 may be doped p-type by ion implantation to form p-wells 240. The p-wells 240 may have a doping concentration of, for example, between $5\times10^{16}/cm^3$ and $5\times10^{19}/cm^3$. An upper portion 242 of each p-well may be more heavily doped with p-type dopants. The upper portion 242 of each p-well 240 may have a doping concentration of, for example, between $2\times10^{18}/cm^3$ and $1\times10^{20}/cm^3$. The p-wells 240 (including the more heavily-doped upper portions 242 thereof) may be formed by ion implantation. As known to those skilled in the art, ions such as n-type or p-type dopants may be implanted in a semiconductor layer or region by ionizing the desired ion species and accelerating the ions at a predetermined kinetic energy as an ion beam towards the surface of a semiconductor layer in an ion implantation target chamber. Based on the predetermined kinetic energy, the desired ion species may penetrate into the semiconductor layer to a certain depth.

Heavily-doped ($n^+$) n-type silicon carbide source regions 250 may be formed in upper portions of the p-wells 240 directly adjacent and contacting the more heavily doped portions 242 of the p-wells 240. The n-type source regions 250 may also be formed by ion implantation. The heavily-doped ($n^+$) n-type silicon carbide regions 250 act as source regions for the unit cell transistor. The drift region 220/current spreading layer 230 and the substrate 210 together act as a common drain region for the power MOSFET 200.

The n-type silicon carbide substrate 210, n-type silicon carbide drift region 220/current spreading layer 230, the p-wells 240, 242 and the n-type source regions 250 formed therein may together comprise a semiconductor layer structure of the semiconductor device 200

A gate insulating pattern 260 may be formed on the upper surface of the semiconductor layer structure over the exposed portions of the current spreading layer 230 and extending onto the edges of the p-wells 240 and n-type source regions 250. The gate insulating pattern 260 may comprise, for example, a silicon oxide layer, although other insulating materials may be used. A gate finger 270 is formed on the gate insulating pattern 260. The gate finger 270 may correspond to one of the gate fingers 132 illustrated in FIG. 2B above. Accordingly, it will be appreciated that the gate finger 270 may be part of a continuous gate electrode pattern that includes a gate pad, a plurality of gate fingers and one or more gate buses. In some embodiments, this gate electrode pattern may comprise, for example, a semiconductor pattern (e.g., polysilicon) or a metal gate pattern.

Source contacts 280 may be formed on the heavily-doped n-type source regions 250 and the more heavily-doped portions 242 of the p-wells. As described above with reference to FIGS. 2A-2B, the source contacts 280 may be part of a continuous source pattern 123 that extends across the upper surface of the silicon carbide semiconductor layer structure. The remainder of the source pattern 123 (as well as the insulating layer that electrically isolates the gate fingers 270 from the source pattern 123) is not shown in FIGS. 3-4 to simplify the drawings. The source contacts 280 may comprise, for example, metals such as nickel, titanium, tungsten or aluminum, or alloys or thin layered stacks of these or similar materials. As describe above, a drain contact 124 may be formed on the lower surface of the substrate 210. The drain contact 124 may comprise, for example, similar materials to the source contact, as this forms an ohmic contact to the silicon carbide substrate.

While the MOSFET 100 is an n-type device with the source contacts 280 on an upper surface thereof and the drain contact 124 on the bottom surface thereof, it will be appreciated that in p-type devices these locations are reversed. Accordingly, in portions of the descriptions below (including the claims) the source contacts and drain contacts may be generically referred to as "source/drain contacts," which term generically refers to either a source contact or a drain contact.

Horizontal channel regions 272 are formed in the p-wells 240 adjacent the gate insulating pattern 260. Current may flow from the n-type source regions 250 through the channel regions 272 to the portion of the drift region 220/current spreading layer 230 that is underneath the gate finger 270 when a voltage is applied to the gate fingers 270, as shown by the arrows in FIG. 4.

Figure 5:
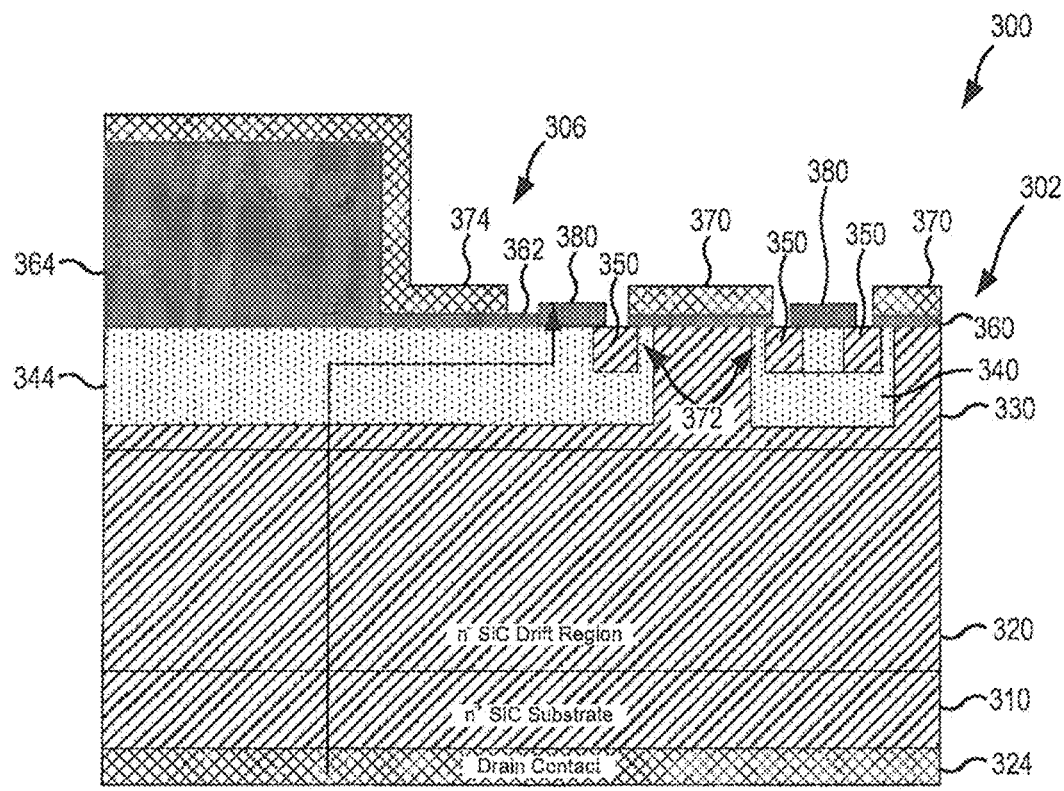
FIG. 5 is a schematic cross-sectional diagram of an interface between a unit cell and an inactive region of a conventional MOSFET.

FIG. 5 is a schematic cross-sectional diagram of an interface between an active region 302 and the gate pad portion 306 of an inactive region of a conventional silicon carbide power MOSFET 300. As shown in FIG. 5, the conventional MOSFET 300 includes a silicon carbide substrate 310 and a silicon carbide drift layer/current spreading layer 320/330 on the substrate 310. In the active region 302, a p-well 340 is provided on the silicon carbide drift layer/current spreading layer 320/330, and a heavily-doped p+ region 342 and heavily-doped n-type source regions 350 are provided in an upper portion of the p-well 340. A gate insulating pattern 360 is provided on the exposed portion of the silicon carbide drift layer/current spreading layer 320/330 and on edges of the p-well 340 and the heavily-doped n-type source regions 350. A gate finger 370 is provided on the gate insulating pattern 360. The right side of FIG. 5 illustrates a unit cell of the conventional MOSFET 300 that is directly adjacent the gate pad portion 306 of an inactive region.

In the gate pad portion 306 of the inactive region, a p-well 344 extends underneath most or all of the gate pad portion region 306 of the inactive region. The p-well 344 may extend for a significant distance in each horizontal direction underneath the gate pad region 306, such as a distance of between 100-300 microns in each direction. A thick field insulating layer 364 is formed on the p-well 344 in the gate pad portion 306 of the inactive region. The field insulating layer 364 may have a thickness of, for example, 600-800 nanometers in the vertical direction (i.e., in a direction perpendicular to the major surfaces of the substrate 310). A gate pad 374 is formed on the field insulating layer 364. As discussed above with reference to FIG. 2B, the gate pad 274 and gate fingers 270 may be part of a continuous gate electrode pattern. A gate insulating pattern 362 is formed on the p-well 344 between the field insulating layer 364 and the source contact 380 that is closest to the gate pad portion 306 of the inactive region As shown by the arrow in FIG. 5, when the MOSFET 300 turns on, a displacement current flows from the drain contact 324 to the source contact 380 that is closest to the gate pad portion 306 of the inactive region. This displacement current flows directly under the gate insulating pattern 362 that is formed on the p-well 344 between the field insulating layer 364 and the source contact 380 that is closest to the gate pad portion 306 of the inactive region of the semiconductor layer structure. This gate insulating pattern 362 may be very thin. As described above, if the displacement current is sufficiently large, then the voltage generated in the p-well 344 may be sufficiently close to the breakdown voltage for the gate insulating pattern 362 such that the gate insulating pattern 362 may be damaged, potentially resulting in device failure.

Pursuant to embodiments of the present invention, power MOSFETs (and other switching devices) are provided that have a dV/dt displacement current path that is spaced apart from the thin gate insulating pattern. In some embodiments, the displacement current path may extend from the drain contact to one or more additional source ohmic contacts that penetrate the field insulating layer. In other embodiments, the displacement current path may extend from the drain contact to one or more additional source ohmic contacts that are provided between the field insulating layer and the thin gate insulating pattern. By shunting the displacement current so that it does not flow adjacent thin gate insulating pattern that borders the field insulating layer, the dV/dt capability of the MOSFETs according to embodiments of the present invention may be significantly enhanced.

Figure 6:
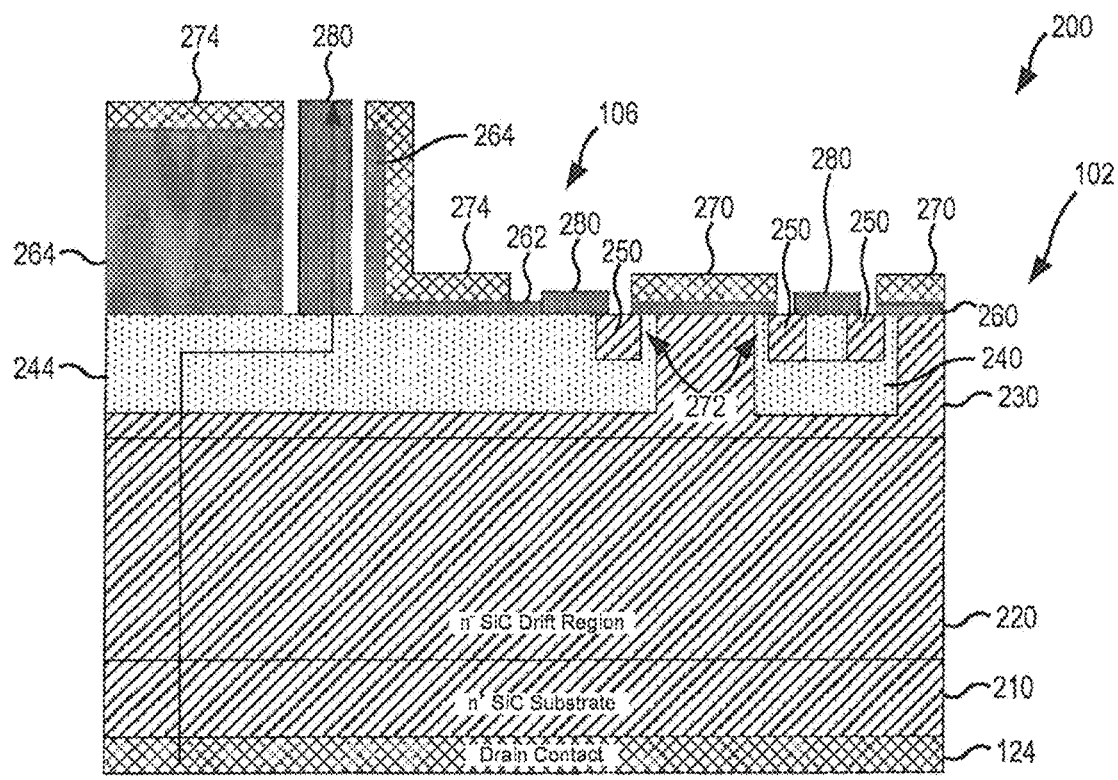
FIG. 6 is a schematic cross-sectional diagram that illustrates an interface between a unit cell and an inactive region of a power MOSFET according to embodiments of the present invention.

FIG. 6 is a schematic cross-sectional diagram that illustrates the interface between a unit cell and an inactive region of a power MOSFET according to embodiments of the present invention. The power MOSFET illustrated in FIG. 6 may be the power MOSFET 100 of FIGS. 1-2B and may have the unit cell design 200 illustrated in FIGS. 3-4.

As shown in FIG. 6, a unit cell 200 is provided in a portion of the active region 102 that is immediately adjacent to the gate pad portion 106 of the inactive region 104. The unit cell 200 illustrated in FIG. 6 may be identical to the unit cell 200 of FIG. 4, and hence further discussion of the unit cell 200 illustrated in FIG. 6 will therefore be omitted. In the gate pad portion 106 of an inactive region 104, a p-well 244 extends underneath most or all of the gate pad 274. The p-well 244 may extend for a significant distance in each direction such as a distance of between 100-300 microns in each direction. A thick field insulating layer 264 is formed on the p-well 244 underneath the gate pad 274. The field insulating layer 264 may comprise, for example, a silicon oxide layer, and may have a thickness of, for example, 600-800 nanometers in the vertical direction. In some embodiments, a thickness of the field insulating layer may be at least 200 nanometers. The gate pad 274 is formed on the field insulating layer 264. A gate insulating pattern 262 is formed on the p-well 244 underneath a lower portion of the gate pad 274. The gate insulating pattern 262 is disposed (in the horizontal direction) between the field insulating layer 264 and the source contact 280 that is closest to the gate pad 274. The gate insulating pattern 262 may comprise, for example, silicon oxide, and may be much thinner than the field insulating layer 264. For example, the gate insulating pattern 262 may have a thickness of between 35-50 nanometers. In some embodiments, a thickness of the field insulating layer 264 may be at least five times a thickness of the gate insulating pattern 262. In other embodiments, a thickness of the field insulating layer 264 may be at least ten times a thickness of the gate insulating pattern 262. In still other embodiments, a thickness of the field insulating layer 264 may be at least fifteen times a thickness of the gate insulating pattern 262. In each of these embodiments, the gate insulating pattern 262 may have the same thickness as the gate insulating layer 260 provided under each gate finger 270, although this need not be the case.

As can be seen, the active region-inactive region interface 102/106 in the MOSFET 100 is similar to the corresponding interface 302/306 in the conventional MOSFET 300. However, in the MOSFET 100 according to embodiments of the present invention, an additional source contact 280 is formed through the field insulating layer 264 to contact the p-well 244. The additional source contact 280 may be positioned close to the edge of the field insulating layer 264 that is adjacent the active region 102. A shown by the arrow in FIG. 6, provision of the additional source contact 280 allows the displacement current that is generated in the gate pad portion 106 of the inactive region 104 to flow through an opening in the field insulating layer 264. As such, the displacement current does not flow adjacent the thin gate insulating pattern 262. This may protect the thin gate insulating pattern 262 from damage during switching that may be caused by a voltage generated in the p-well 244.

The additional source contact 280 is between the thin gate insulating pattern 262 and a center C (see FIG. 2B) of the field insulating layer 280. It will be appreciated that the field insulating layer is not visible in FIG. 28, as it is covered by the gate bond pad 120 and the gate pad 274, but the location of the center C is denoted by a black circle for point of reference. The center C of the field insulating layer 280 is also not visible in FIG. 6, but would be on the left side of the field insulating layer 280. This can be seen with reference to FIGS. 2B and 7.

Figure 7:
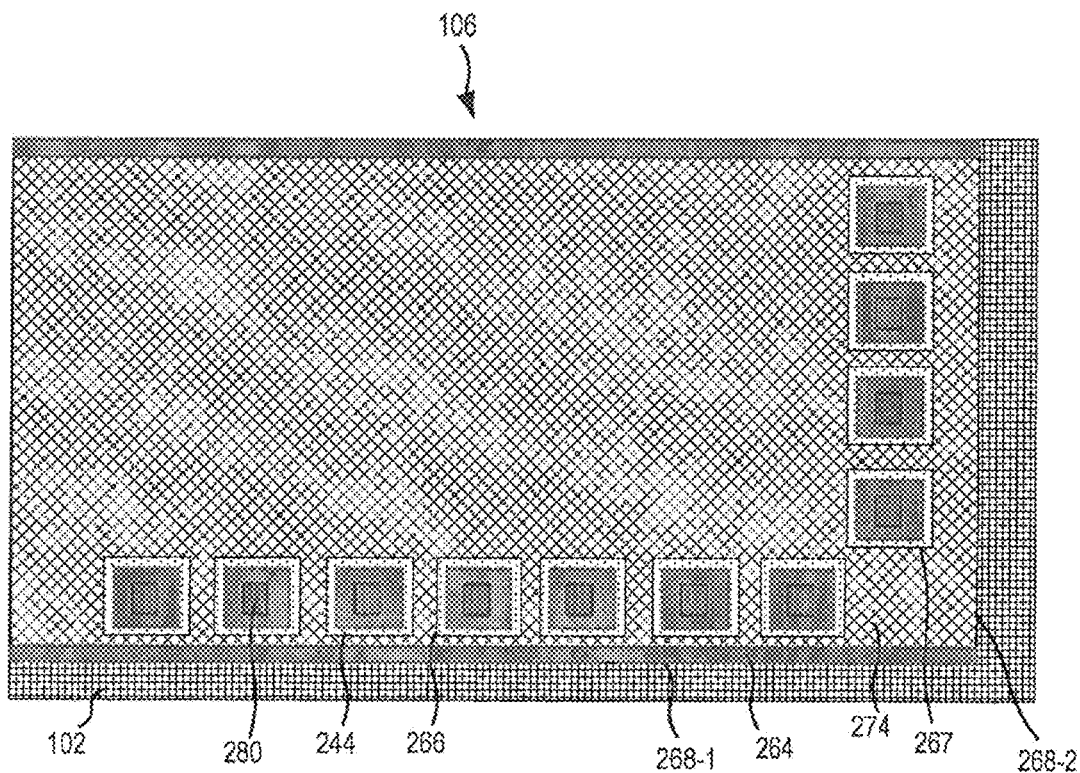
FIG. 7 is a schematic plan view of an interface between a unit cell and a gate pad portion of an inactive region of the MOSFET of FIG. 6.

FIG. 7 is a schematic plan view of an interface between a unit cell 200 and the gate pad portion 106 of an inactive region 104 of the MOSFET 100 of FIGS. 2A-2B and 6. The dashed box labeled 140 in FIG. 2A represents the region illustrated in FIG. 7. In FIG. 7, the active region 102 of the device is shown schematically as a hatched region.

As discussed above, in the gate pad portion 106 of an inactive region 104, a p-well 244 is formed in the upper surface of the semiconductor layer structure. A field insulating layer 264 is formed on the p-well 244, and a gate pad 274 of the gate electrode pattern is formed on the field insulating layer 264. A gate bond pad 120 (not shown in FIG. 7) is formed on the gate pad 274. The field insulating layer 264 may be a thick layer and may have a plurality of sidewalls that extend vertically from the upper surface of the semiconductor layer structure. As shown in FIG. 7, a plurality of openings 266 are provided in the field insulating layer 264 near a first sidewall 268-1 thereof that is closest to the drain bond pads 122-1, 122-2 (see FIG. 2). Additional or "extra" source/drain contacts 280 (here source contacts) are formed on the p-well 244 of the semiconductor layer structure in the respective openings 266. One of these extra source/drain contacts 280 may correspond to the left-most source contact 280 shown in FIG. 6. The gate pad 274 is also removed in the vicinity of the openings 266 to allow formation of the extra source/drain contacts 280 and to prevent the gate pad 274 from short-circuiting to the extra source/drain contacts 280.

The extra source/drain contacts 280 in the openings 266 provide a displacement current path for portions of the gate pad portion 106 of the inactive region 104 that are near the first sidewall 268-1. As is further shown in FIG. 7, in some embodiments, additional extra source/drain contacts 280 may be provided in additional openings 267 in the field insulating layer 264. For example, FIG. 7 illustrates a plurality of additional openings 267 that are near a second sidewall 268-2 of the field insulating layer 264. The gate pad 274 is also removed in the vicinity of each opening 267 to allow formation of the extra source/drain contacts 280 and to prevent the gate pad 274 from short-circuiting to these extra source/drain contacts 280. The extra source/drain contact 280 in the openings 267 provide displacement current paths for portions of the gate pad portion 106 of the inactive region 104 that are near the second sidewall 268-2. Similar openings in the field insulating layer and extra source/drain contacts 280 may also be provided, if desired, near each additional sidewall of the field oxide layer 264. As will be discussed below with reference to FIG. 8, in some embodiments, the extra source/drain contacts 280 may be formed directly next to the sidewalls 268 of the field insulating layer 264. In such embodiments, the openings 266, 267 in the field insulating layer 264 may be omitted.

While the extra source/drain contacts 280 formed in openings 266, 267 are pillar-shaped, it will be appreciated that in other embodiments the extra source/drain contacts 280 may have different shapes.

Figure 8:
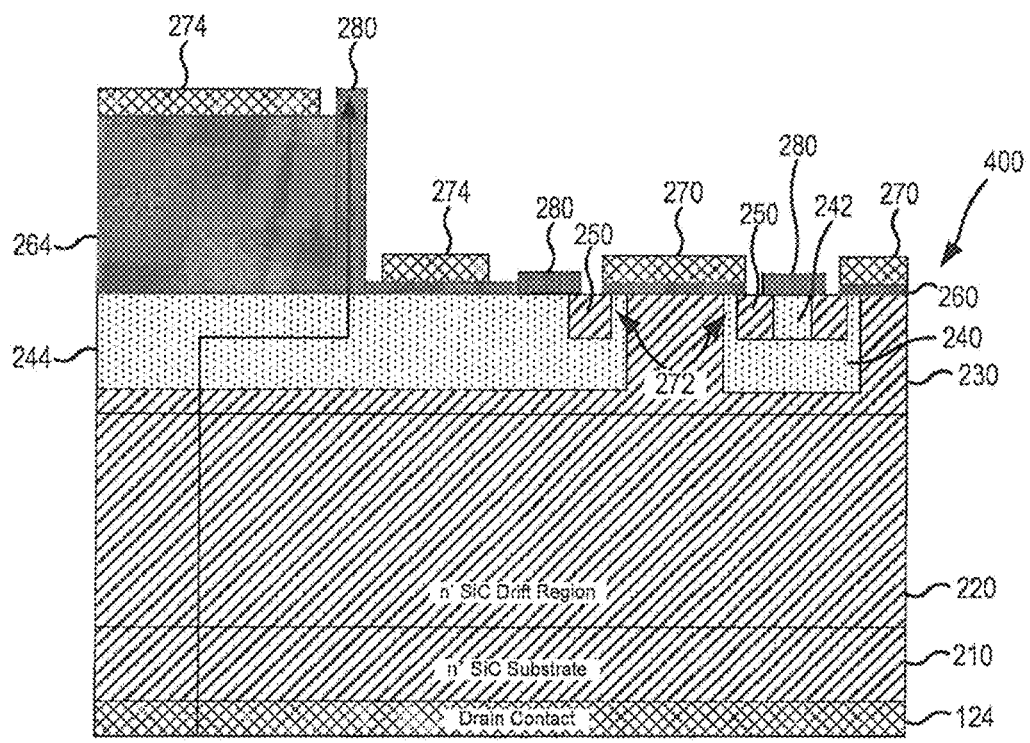
FIG. 8 is a schematic cross-sectional diagram that illustrates an interface between a unit cell and an inactive region of a power MOSFET according to further embodiments of the present invention.

FIG. 8 is a schematic cross-sectional diagram that illustrates the interface between a unit cell and an inactive region of a power MOSFET 400 according to further embodiments of the present invention. As can be seen by comparing FIGS. 6 and 8, the power MOSFET 400 is very similar to the power MOSFET 100. However, in the power MOSFET 400 the extra source contact 280 is positioned directly adjacent the field insulating layer 264 as opposed to penetrating through the field insulating layer 264. The provision of the extra source contact 280 again serves to divert the displacement current generated in the gate pad portion 106 of the inactive region 104 of the device from flowing directly adjacent the thin gate insulating pattern 262, as shown by the arrow in FIG. 8 indicating the current path for this displacement current. Thus, the MOSFET 400 of FIG. 8 may also exhibit significantly enhanced dV/dt performance. It will be appreciated that a plurality of the extra source contacts 280 may be provided in the manner described above with reference to FIG. 7, except that the extra source contacts 280 would be in the different locations discussed above (i.e., along the edge of the field insulating layer 264).

Figure 9:
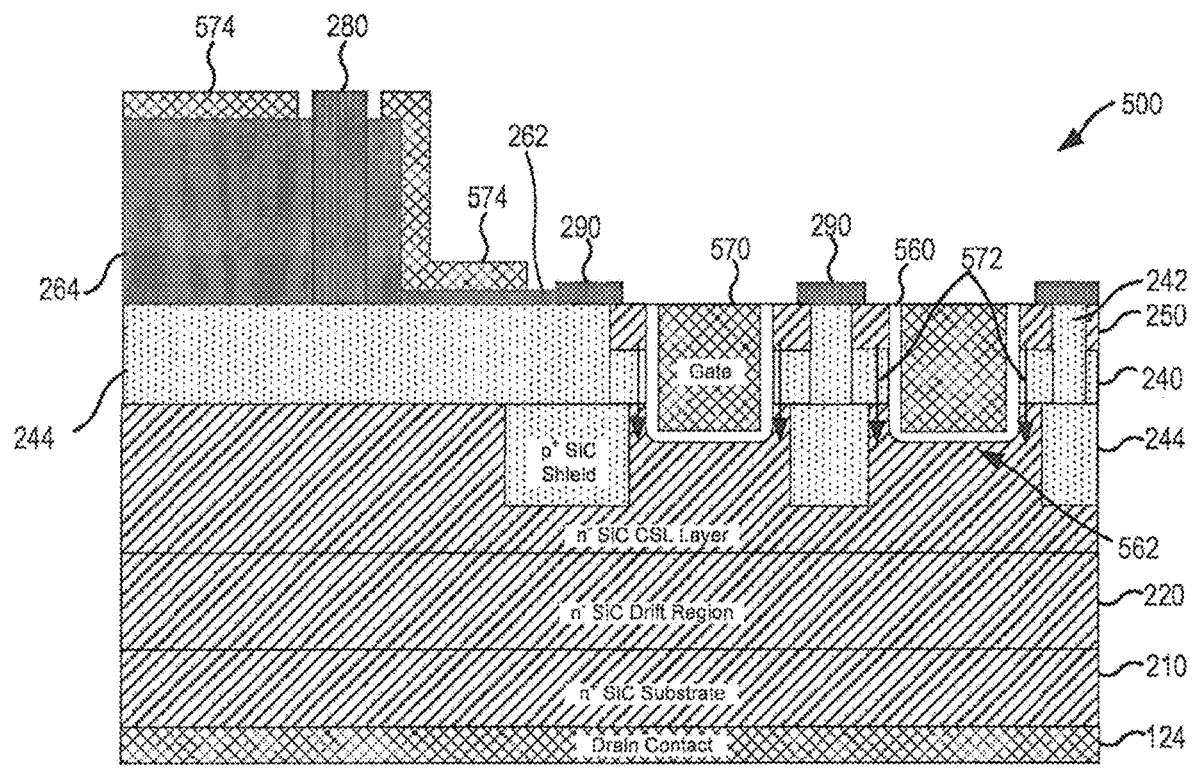
FIG. 9 is a schematic cross-sectional diagram that illustrates an interface between a unit cell and an inactive region of a UMOSFET according to embodiments of the present invention.

FIG. 9 is a schematic cross-sectional diagram that illustrates the device structure at an interface between a unit cell and an inactive region of a UMOSFET 500 according to embodiments of the present invention. The UMOSFET 500 is similar to the MOSFET 100 described above with reference to FIGS. 2A-4 and 6. Accordingly, the description below will focus only on the differences between the UMOSFET 500 and the previously described MOSFET 100.

As can be seen from FIG. 9, the primary difference between the UMOSFET 500 and the previously described MOSFET 100 is that the UMOSFET 500 includes gate trenches 562. Instead of having a planar gate insulating pattern, a U-shaped gate insulating pattern 560 is formed within the gate trenches 562. A respective gate finger 570 then fills the remainder of each gate trench 562. Since the individual gate fingers 570 penetrate into the upper surface of the semiconductor layer structure, the channels are now vertical channel 572 that extend through the portion of the p-wells 240 that are underneath the n-type source regions 250. Additionally, p-type shielding patterns 244 may be formed underneath the p-wells 240 (e.g., by ion implantation) in order to protect portions of the gate insulating pattern 560 that are adjacent the corners of the gate trenches from high electric fields that may degrade the gate insulating pattern 560.

The UMOSFET 500 further includes the extra source contacts 280 that penetrates the field insulating layer 264 to provide a displacement current path that does not run adjacent the thin gate insulating pattern 262. It will be appreciated that the UMOSFET 500 may also be modified to have the extra source contact design shown in FIG. 8 according to further embodiments of the present invention.

Figure 10:
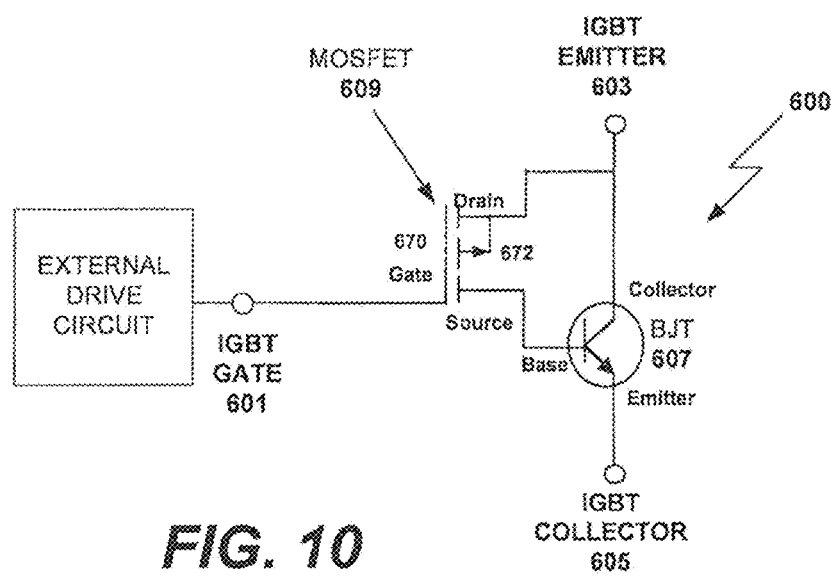
FIG. 10 is a simplified circuit diagram of an n-channel power IGBT.
Figure 11:
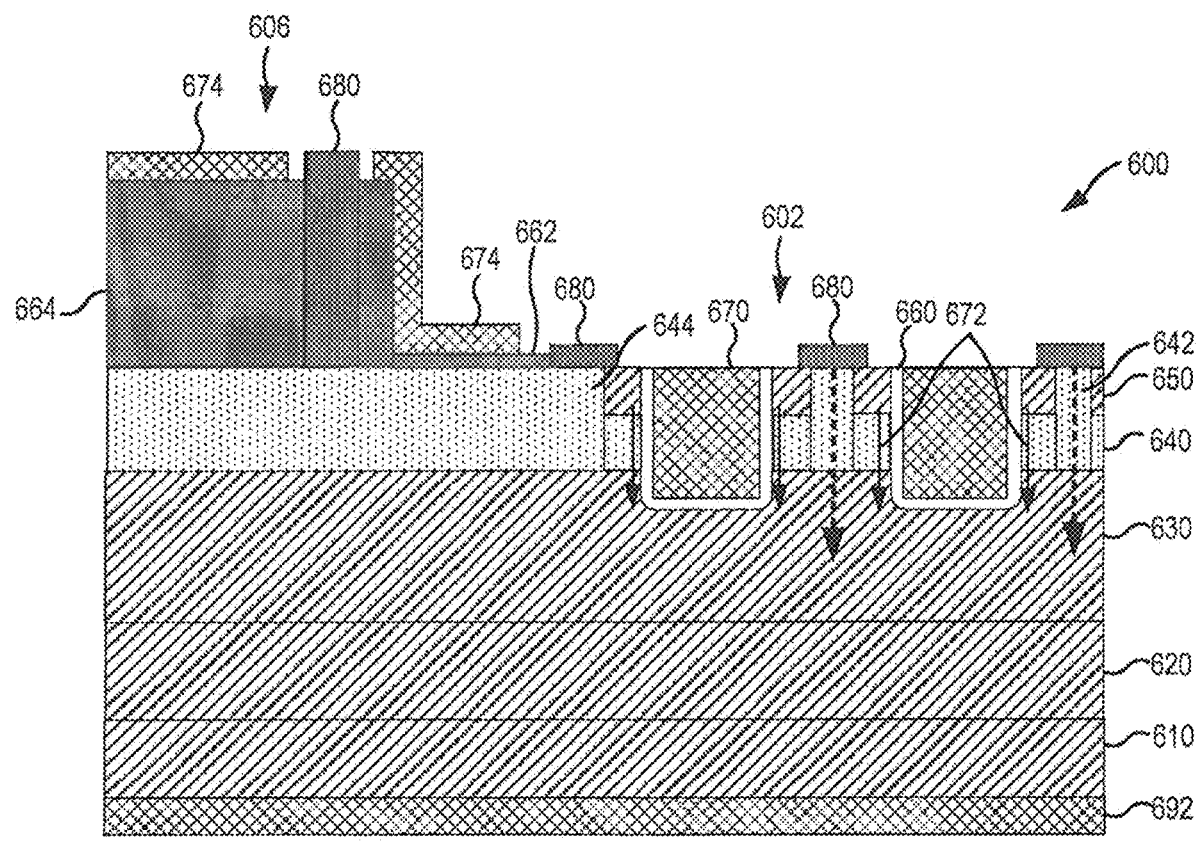
FIG. 11 is a schematic cross-sectional diagram that illustrates an interface between a unit cell and an inactive region of an IGBT according to embodiments of the present invention.

FIG. 10 is a simplified circuit diagram of an n-channel silicon carbide power IGBT 600 according to further embodiments of the present invention. FIG. 11 is a schematic cross-sectional diagram of the IGBT 600 of FIG. 10.

As shown in FIG. 10, the IGBT 600 includes an p-n-p silicon carbide power BJT 607 that has a base, an emitter and a collector. The IGBT 600 further includes a silicon carbide MOSFET 609 having a gate, a source and a drain. The source of the silicon carbide MOSFET 609 is electrically connected to the base of the silicon carbide power BJT 607, and the drain of the silicon carbide MOSFET 609 is electrically connected to the collector of the silicon carbide power BJT 607. By convention, the collector of the BJT 607 is the emitter 603 of the IGBT 600, and the emitter of the BJT 607 is the collector 605 of the IGBT 600, and the gate 670 of the MOSFET 609 is the gate 601 of the IGBT 600.

Referring to FIGS. 10-11, an external drive circuit is connected to the gate 601 of the IGBT 600 for applying a gate bias voltage to the MOSFET 609. When this external drive circuit applies a voltage to the gate 601 of IGBT 600 that is greater than the threshold voltage of the MOSFET 609, an inversion layer is formed in a semiconductor layer that is beside the gate 601 which acts as a channel 672 that electrically connects the $n^+$ emitter 603 of the IGBT 600 to the base of BJT 607. Note that the gate 601 of IGBT 600 is the gate 670 of MOSFET 609. Electrons are injected from the $n^+$ emitter region 603 through the channel 672 into the base of BJT 607. This electron current acts as the base current that drives the BJT 607. In response to this electron current, holes are injected from the collector 605 of IGBT 600 across the base of BJT 607 to the emitter 603 of IGBT 600. Thus, the silicon carbide MOSFET 609 converts the silicon carbide power BJT 607 from a current driven device to a voltage driven device, which may allow for a simplified external drive circuit. The silicon carbide MOSFET 609 acts as a driver transistor, and the silicon carbide power BJT 607 acts as the output transistor of the IGBT 600.

FIG. 11 is a schematic cross-sectional diagram of a portion of the IGBT 600 of FIG. 10 that illustrates a pair of unit cells of the power IGBT 600 that are adjacent the gate pad portion 606 of an inactive region of the IGBT 600. It will be appreciated that to form the power IGBT 600, typically a large number of unit cells are implemented in parallel.

As shown in FIG. 11, the IGBT 600 may be formed on, for example, a heavily-doped p-type silicon carbide layer 610. The p-type layer 610 may, for example, be epitaxially grown on a silicon carbide substrate and the substrate may thereafter be removed. The $p^+$ layer 610 acts as the collector 605 of the IGBT 600 (and hence also as the emitter of the BJT 607). A lightly-doped n-type (n) silicon carbide drift layer 620 is provided on the p-type layer 610. A moderately-doped n-type silicon carbide current spreading layer 630 is provided in the upper portion of the drift region 620. The n-type silicon carbide layers 620, 630 act as the base of the BJT 607 and as the source region of the MOSFET 609. The n-type silicon carbide layers 620, 630 may be formed via epitaxial growth.

P-wells 640 may be formed on the n-type silicon carbide current spreading layer 630. The p-wells 640 may be formed by ion implantation. A portion of each p-well 640 may be more heavily doped with p-type dopants to form a heavily-doped $p^+$ silicon carbide emitter region 642 (which also acts as the collector of the BJT 607). Heavily-doped ($n^+$) n-type silicon carbide drain regions 650 may be formed in upper portions of the p-wells 640 adjacent the respective heavily-doped p-type silicon carbide emitter regions 642. Each n-type drain region 650 may be directly adjacent and contacting a respective one of the more heavily-doped p-type silicon carbide emitter regions 642. The $n^+$ silicon carbide drain region 650 acts as a common drain for the IGBT 600.

An ohmic contact 680 is formed to contact the p+ silicon carbide emitter region 642 and the n+ silicon carbide drain region 650, and an ohmic contact 692 is formed on the back side of the p+ silicon carbide layer 610.

Gate trenches are formed in the silicon carbide semiconductor layer structure. The gate trenches may also extend into the upper surface of the n-type current spreading layer 630. The gate trenches may have a U-shaped cross-section. A gate insulating layer 660 such as a silicon oxide layer is formed on the bottom surface and sidewalls of each gate trench. A gate finger 670 that acts as the gate 601 of the IGBT 600 is formed on each gate insulating layer 660 to fill the respective gate trenches. The gate fingers 670 may comprise, for example, polysilicon. Lower portions of the p-wells 640 may comprise the vertical channels 672 of the MOSFET 609 of power IGBT 600.

The IGBT 600 may operate as follows. When a bias voltage that exceeds the threshold voltage of the MOSFET 609 is applied to the gate 601, an electron current flows across the channels 672 of MOSFET 609 into the base of the BJT 607, as indicated by the solid bold arrows in FIG. 11. In response to this base current, a hole current (shown by the dashed arrows in FIG. 11) flows from the heavily-doped p-type emitter region 642 of the IGBT 600 through the p-wells 640 to the collector 605 of the IGBT 600.

As is further shown in FIG. 11, the IGBT 600 includes an active region 602, which includes the above-described unit cells, as well as an inactive region that includes a gate pad portion 606. The gate pad portion 606 of the inactive region may have the exact same design as the gate pad portion 606 of the inactive region of MOSFET 100 in order to provide a displacement current path that flows through the inactive region (e.g., through the field insulating layer 664) so that the displacement current does not flow underneath the thin gate insulating pattern 662. Accordingly, further description of the gate pad portion 606 of the inactive region of IGBT 600 will be omitted. It will be appreciated that the IGBT may have a planar gate electrode design (like the MOSFET 200 of FIG. 6) in other embodiments, or may have the design for the gate pad portion of the inactive region shown in the MOSFET 400 of FIG. 8 in still other embodiments.

The power switching devices according to embodiments of the present invention may provide significantly improved dV/dt displacement current capability, without adding any fabrication or process cost, and without any material impact on other performance parameters of the device. In fact, in some embodiments, the invention may be implemented by making minor changes to the masks used to form the field insulating layer, the gate electrode pattern, and/or the source/drain contact mask to form openings in the field insulating layer and deposit additional source/drain contacts therein that shunt the dV/dt induced displacement current through the field insulating layer to the source bond pads.

Herein, embodiments of the present invention are described with respect to cross-sectional diagrams that show one or two unit cells of a power switching devices. It will be appreciated that actual implementations will typically include a much larger number of unit cells. However, it will also be appreciated that the present invention is not limited to such devices, and that the claims appended hereto also cover MOSFETs and other power switching devices that comprise, for example, a single unit cell. Moreover, while the present disclosure focuses on silicon carbide devices, it will be appreciated that embodiments of the present invention may also have applicability to devices formed using other wide band-gap semiconductors such as, for example, gallium nitride, zinc selenide or any other II-VI or III-V wide band-gap compound semiconductors.

While FIGS. 2-9 each illustrate the structure of a unit cell of an n-channel MOSFET, it will be appreciated that pursuant to further embodiments of the present invention, the polarity of each of the semiconductor layers in each device could be reversed so as to provide corresponding p-channel MOSFETs.

The invention has been described above with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or elements, these regions, layers and/or elements should not be limited by these terms. These terms are only used to distinguish one region, layer or element from another region, layer or element. Thus, a first region, layer or element discussed below could be termed a second region, layer or element, and similarly, a second region, layer or element may be termed a first region, layer or element without departing from the scope of the present invention.

Relative terms, such as "lower" or "bottom" and "upper" or "top," may be used herein to describe one element's relationship to another element as illustrated in the drawings. It will be understood that relative terms are intended to encompass different orientations of the device in addition to the orientation depicted in the drawings. For example, if the device in the drawings is turned over, elements described as being on the "lower" side of other elements would then be oriented on "upper" sides of the other elements. The exemplary term "lower" can, therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including," when used herein, specify the presence of stated features, elements, and/or components, but do not preclude the presence or addition of one or more other features, elements, components, and/or groups thereof.

Embodiments of the invention are described herein with reference to cross-sectional illustrations that are schematic illustrations. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of the invention.

It will be understood that the embodiments disclosed herein can be combined. Thus, features that are pictured and/or described with respect to a first embodiment may likewise be included in a second embodiment, and vice versa.

While the above embodiments are described with reference to particular figures, it is to be understood that some embodiments of the present invention may include additional and/or intervening layers, structures, or elements, and/or particular layers, structures, or elements may be deleted. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed is:

1. A power switching device, comprising:
    a field insulating layer;
    a semiconductor layer structure comprising an active region and an inactive region, the active region comprising a plurality of unit cells and the inactive region comprising a drift region having a first conductivity type, a well region having a second conductivity type that is opposite the first conductivity type between the drift region and the field insulating layer;
    a gate pad on the field insulating layer opposite the drift region;
    a gate insulating pattern on the semiconductor layer structure between the active region and the field insulating layer;
    a first contact on the inactive region between the gate insulating pattern and a center of the field insulating layer;
    a gate trench in the active region of the semiconductor layer structure, the gate trench comprising a gate finger below a top surface of the semiconductor layer structure; and
    a shielding pattern having the second conductivity type between the well region and a bottom surface of the drift region, wherein the shielding pattern extends to a depth in the drift region that is below a bottom surface of the gate finger.

2. The power switching device of claim 1, wherein the well region extends continuously under the field insulating layer, the first contact, and a portion of the gate insulating pattern.

3. The power switching device of claim 1, wherein the gate trench extends below a bottom surface of the well region.

4. The power switching device of claim 1, wherein the first contact penetrates the gate pad and the field insulating layer to directly contact the semiconductor layer structure.

5. The power switching device of claim 1, wherein at least a portion of the gate pad extends on the field insulating layer from a first side of the field insulating layer to a second side of the field insulating layer.

6. The power switching device of claim 1, further comprising a second contact that is electrically coupled to the first contact,
    wherein a portion of the field insulating layer is between the first contact and the second contact.

7. The power switching device of claim 6, wherein the first contact is a first source/drain contact and the second contact is a second source/drain contact.

8. The power switching device of claim 6, wherein the first and second contacts are ohmic contacts.

9. The power switching device of claim 1, wherein an area between the first contact and the active region is free of the field insulating layer.

10. The power switching device of claim 1, further comprising a second contact that is electrically coupled to the first contact, wherein a portion of the gate insulating pattern is between the second contact and the field insulating layer.

11. A power switching device, comprising:
    a semiconductor layer structure comprising an active region and an inactive region;
    a gate pad on the inactive region;
    a field insulating layer on the semiconductor layer structure in the inactive region, the field insulating layer comprising a first edge and a second edge, wherein the first edge is opposite the second edge;
    a first unit cell transistor in the active region adjacent the first edge of the field insulating layer;
    a second unit cell transistor in the active region adjacent the second edge of the field insulating layer;
    a plurality of gate fingers in the active region and electrically coupled to the gate pad, respective ones of the gate fingers having at least a portion below an upper surface of the semiconductor layer structure; and
    a first contact on the inactive region and penetrating the field insulating layer,
    wherein at least a portion of the gate pad extends on the field insulating layer from the first edge of the field insulating layer to the second edge of the field insulating layer.

12. The power switching device of claim 11, further comprising a well region having a second conductivity type that is opposite the first conductivity type below the field insulating layer, and
    wherein the first contact is electrically coupled to the well region.

13. The power switching device of claim 11, further comprising a gate insulating pattern on the semiconductor layer structure in the inactive region between the active region and the field insulating layer, wherein the first contact is between the gate insulating pattern and a center of the field insulating layer.

14. The power switching device of claim 11, further comprising a shielding pattern having a second conductivity type that is opposite the first conductivity type below the field insulating layer.

15. The power switching device of claim 14, wherein the shielding pattern has a bottom surface that is at a level that is below a bottom surface of at least one of the gate fingers.

16. The power switching device of claim 11, further comprising:
  a second contact electrically coupled to the first contact and to a first region having a first conductivity type in the semiconductor layer structure; and
  a well region having a second conductivity type that is opposite the first conductivity type below the second contact, wherein a bottom surface of the well region is at a level that is below a bottom surface of at least one of the gate fingers.

17. A power switching device, comprising:
  a semiconductor layer structure comprising an active region and an inactive region on a substrate;
  a field insulating layer on the inactive region;
  a gate pad on the field insulating layer;
  a shunt displacement current path that is configured to shunt dV/dt-induced displacement current through the inactive region to a contact on the inactive region;
  a gate insulating pattern in the inactive region of the semiconductor layer structure between the active region and the field insulating layer;
  a unit cell transistor in the active region of the semiconductor layer structure, the unit cell transistor comprising:
    a gate finger that is electrically coupled to the gate pad and extends below a top surface of the semiconductor layer structure; and
    a source region having a first conductivity type adjacent the gate finger; and
  a first well region that extends under the contact and a portion of the field insulating pattern, the first well region having a second conductivity type that is opposite the first conductivity type; and
  a second well region between the source region and the substrate, the second well region having the second conductivity type and having a bottom surface at a level that is between the substrate and a bottom surface of the gate finger.

18. The power switching device of claim 17, wherein the contact is within an opening in the gate pad and the field insulating layer on the inactive region.

19. The power switching device of claim 17, wherein the first well region extends continuously under the contact and a portion of the gate insulating pattern.

20. The power switching device of claim 17, wherein the contact is a first contact, and wherein the power switching device further comprises a second contact that electrically coupled to the first contact.

21. The power switching device of claim 17, wherein the inactive region of the semiconductor layer structure comprises a drift region having the first conductivity type, and wherein the first well region is between the drift region and the field insulating layer, and
  wherein the first well region extends continuously under the field insulating layer, the contact, and a portion of the gate insulating pattern.

22. The power switching device of claim 21, wherein the gate finger extends below a bottom surface of the first well region.

23. The power switching device of claim 17, further comprising a shielding pattern having the second conductivity type between the substrate and the first well region.

24. The power switching device of claim 23, wherein the shielding pattern extends to a level that is below the bottom surface of the gate finger.

* * * * *

UNITED STATES PATENT AND TRADEMARK OFFICE
CERTIFICATE OF CORRECTION

PATENT NO. : 11,184,001 B2
APPLICATION NO. : 16/811526
DATED : November 23, 2021
INVENTOR(S) : Zhang et al.

Page 1 of 1

It is certified that error appears in the above-identified patent and that said Letters Patent is hereby corrected as shown below:

In the Specification

Column 12, Line 40: Please correct "41H" to read -- 4H --

Column 12, Line 49: Please correct "(n)" to read -- (n⁻) --

Column 16, Line 15: Please correct "FIG. 28" to read -- FIG. 2B --

Column 18, Line 47: Please correct "(n)" to read -- (n⁻) --

In the Claims

Column 24, Line 19, Claim 20: Please correct "that electrically" to read -- that is electrically --

Signed and Sealed this
Fourteenth Day of June, 2022

Katherine Kelly Vidal
*Director of the United States Patent and Trademark Office*